(12) United States Patent
Lin et al.

(10) Patent No.: US 10,096,481 B1
(45) Date of Patent: Oct. 9, 2018

(54) METHOD FOR FORMING SEMICONDUCTOR STRUCTURE

(71) Applicant: Taiwan Semiconductor Manufacturing Co., Ltd., Hsinchu (TW)

(72) Inventors: Li-Yen Lin, Wujie Township, Yilan County (TW); Ching-Yu Chang, Yilang County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/597,372

(22) Filed: May 17, 2017

(51) Int. Cl.
*H01L 21/00* (2006.01)
*H01L 21/306* (2006.01)
*H01L 21/3065* (2006.01)
*H01L 21/265* (2006.01)

(52) U.S. Cl.
CPC .. *H01L 21/30604* (2013.01); *H01L 21/26506* (2013.01); *H01L 21/3065* (2013.01)

(58) Field of Classification Search
CPC ......... H01L 21/30604; H01L 21/26506; H01L 21/3065; H01L 21/02126; H01L 21/0271; H01L 21/3081; H01L 21/02118
See application file for complete search history.

(56) References Cited

U.S. PATENT DOCUMENTS

| 6,187,505 B1* | 2/2001 | Lin | ............... G03F 7/0045 430/270.1 |
| 8,753,797 B2* | 6/2014 | Lin | ............... G03F 7/09 430/311 |

* cited by examiner

*Primary Examiner* — Nikolay Yushin
(74) *Attorney, Agent, or Firm* — Birch, Stewart, Kolasch & Birch, LLP

(57) ABSTRACT

A method for forming a semiconductor device structure is provided. The method includes forming a bottom layer over a substrate and forming a middle layer over the bottom layer. The middle layer includes a carbon backbone and a first side chain bonded to the carbon backbone, and the first side chain has a hydrophilic group. The method includes forming a top layer over the middle layer and patterning the top layer to form a patterned top layer. The method includes patterning the middle layer by using the patterned top layer as a mask to form a patterned middle layer. The method includes patterning the bottom layer to form a patterned bottom layer. The method also includes removing the patterned middle layer by a base solution, and the middle layer is soluble in the base solution by the hydrophilic group.

20 Claims, 14 Drawing Sheets

(VIII)

(IX)

(X)

(XI)

(XII)

(XIII)

(XV)

METHOD FOR FORMING SEMICONDUCTOR STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
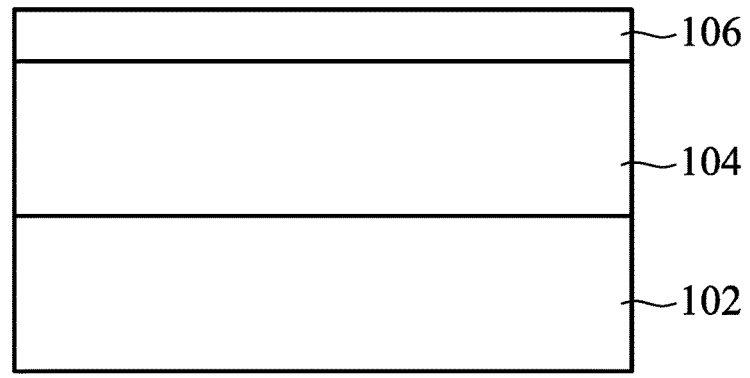
FIGS. 1A-1I show cross-sectional representations of various stages of forming a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a semiconductor structure and method for forming the same are provided. FIGS. 1A-1I show cross-sectional representations of various stages of forming a semiconductor structure, in accordance with some embodiments of the disclosure.

Referring to FIG. 1A, a substrate 102 is provided. The substrate 102 may be made of silicon or other semiconductor materials. In some embodiments, the substrate 102 is a wafer. Alternatively or additionally, the substrate 102 may include other elementary semiconductor materials such as germanium. In some embodiments, the substrate 102 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Some device elements may be formed over the substrate 102. The device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes.

The substrate 102 may include various doped regions such as p-type wells or n-type wells). Doped regions may be doped with p-type dopants, such as boron or $BF_2$, and/or n-type dopants, such as phosphorus (P) or arsenic (As). In some other embodiments, the doped regions may be formed directly on the substrate 102.

The substrate 102 also includes isolation structures (not shown). The isolation structure is used to define and electrically isolate various devices formed in and/or over the substrate 102. In some embodiments, the isolation structure includes shallow trench isolation (STI) structure, local oxidation of silicon (LOCOS) structure, or another applicable isolation structure. In some embodiments, the isolation structure includes silicon oxide, silicon nitride, silicon oxynitride, fluoride-doped silicate glass (FSG), or another suitable material.

Next, a material layer 104 is formed over the substrate 102. The material layer 104 is configured to be patterned or doped in subsequent manufacturing processes. The material layer 104 may be one or more material layers. In some embodiments, the material layer 104 includes a silicon layer, a dielectric layer, and/or a doped poly-silicon layer.

Afterwards, a bottom layer 106 is formed over the material layer 104. The bottom layer 106 may be a first layer of a tri-layer resist layer (also referred to as tri-layer photoresist). The bottom layer 106 may contain a material that is patternable and/or have an anti-reflection property. In some embodiments, the bottom layer 106 is a bottom anti-reflective coating (BARC) layer. In some embodiments, the bottom layer 106 includes a carbon backbone polymer. In some embodiments, the bottom layer 106 is made of silicon free material. In some embodiments, the bottom layer 106 is formed by a spin-on coating process, chemical vapor deposition process (CVD), physical vapor deposition (PVD) process, and/or other suitable deposition processes.

Figure 1B:
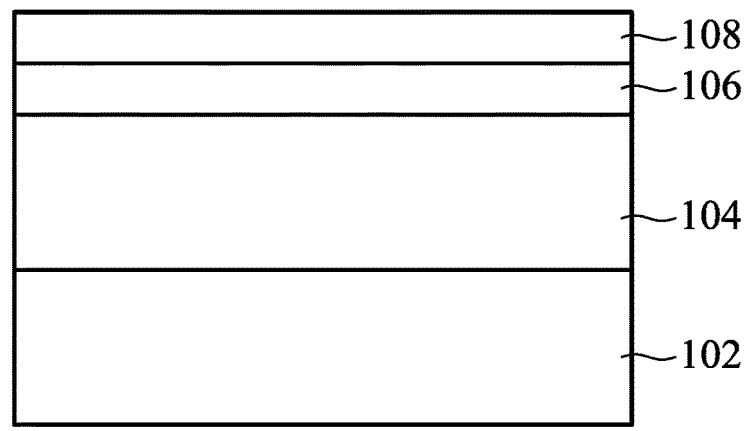

Afterwards, as shown in FIG. 1B, a middle layer 108 is formed over the bottom layer 106, in accordance with some embodiments of the disclosure. The middle layer 108 may have a composition that provides an anti-reflective property and/or hard mask property for the photolithography process. In addition, the middle layer 108 is designed to provide etching selectivity from the bottom layer 106 and a top layer 110.

In some embodiments, the middle layer 108 includes a carbon backbone and a number of side chains bonded to the carbon backbone. The middle layer 108 may include a silicon-containing inorganic polymer, and a number of silicon-oxygen (Si—O) bonds are at the side chain. In some embodiments, the middle layer 108 has the following formula (I) as shown in FIG. 2:

$R_1$ is hydrogen or liner $C_1$-$C_6$ alkyl; $R_2$ is hydrogen or liner $C_1$-$C_6$ alkyl; each x, y, z independently represents a mole ratio of each monomer unit, and x+y+z=1; each m, p, q independently represent an integer of 0 or 1; and A is a siloxane-based group; B is crosslinkable group; and D is hydrophilic group.

Figure 2:
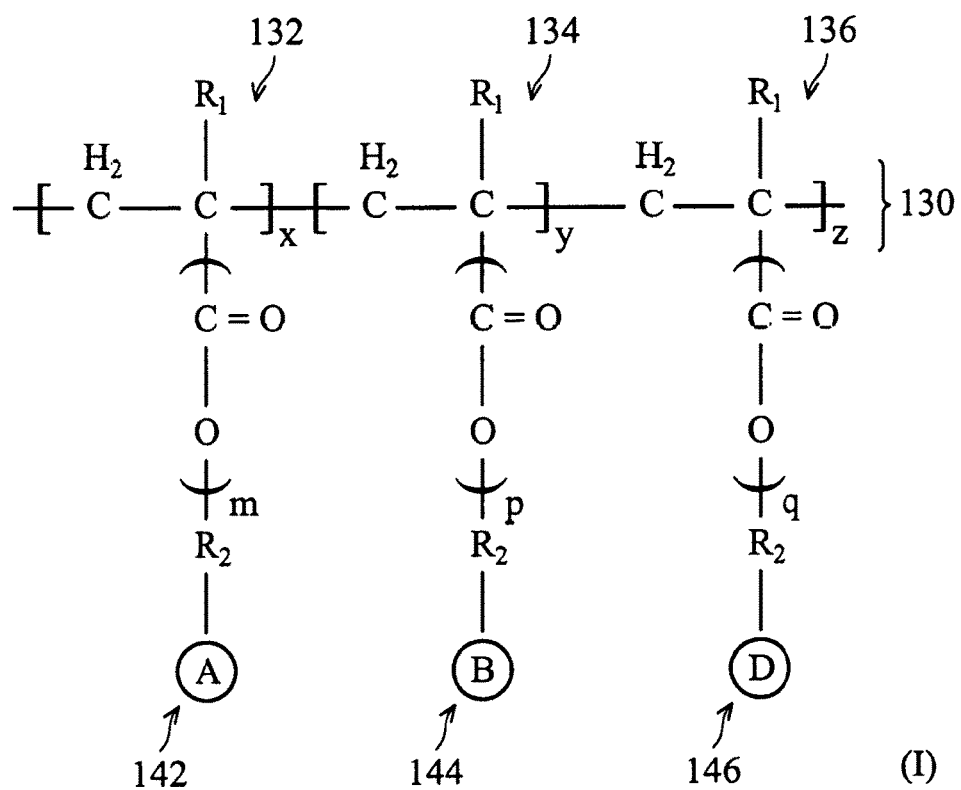
FIG. 2 shows a diagrammatical view of a chemical structure of the middle layer, in accordance with some embodiments of the disclosure.

FIG. 2 shows a diagrammatical view of a chemical structure of the middle layer 108, in accordance with some embodiments of the disclosure.

As shown in FIG. 2, the chemical structure of the middle layer 108 includes a carbon backbone 130 having a plurality of carbon atoms chemically bonded together. The backbone 130 includes a first segment 132, a second segment 134 and a third segment 136. The first segment 132 is bonded to a first group 142, the second segment 134 is bonded to a second group 144, and the third segment 136 is bonded to a third group 146.

In some embodiments, the ratio (x/x+y+z) of x to sum of x, y and z is in a range from about 40% to about 80%. In some embodiments, the ratio (y/x+y+z) of y to sum of x, y and z is in a range from about 10% to about 50%. In some other embodiments, the ratio (z/x+y+z) of z to sum of x, y and z is in a range from about 10% to about 50%.

In some embodiments, the formation of the middle layer 108 includes a deposition process and curing process. In some embodiments, the deposition process includes a spin-on coating process, chemical vapor deposition process (CVD), physical vapor deposition (PVD) process, and/or other suitable deposition processes. In some embodiments, the curing process includes a thermal baking process with a suitable baking temperature.

During the curing process, the first segment 132 and the second segment 134 both have the function to facilitate the film formation of the middle layer 108. Therefore, if the amount of the first segment 132 is enough to form a film, the amount of the second segment 134 may be not too much, and vice versa. In some embodiments, a first mole ratio of the first segment 132 is inversely proportional to second mole ratio of the second segment 134. More specifically, the first mole ratio of the first segment 132 is increased as the second mole ratio of the second segment 134 is decreased. In other words, the first mole ratio of the first segment 132 is decreased as the second mole ratio of the second segment 134 is increased.

Figure 3A:
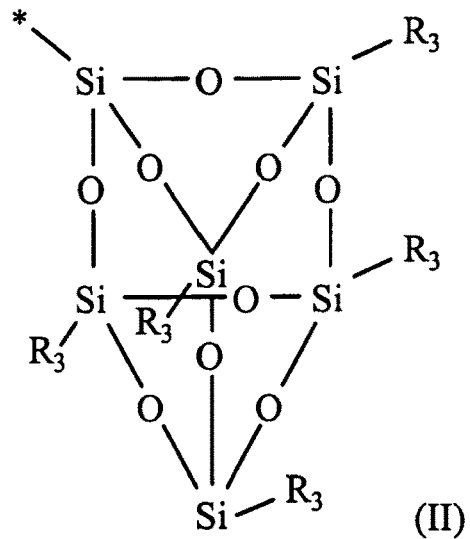
FIGS. 3A-3H show diagrammatical views of chemical formulas (II)-(IX), in accordance with some embodiments of the disclosure.
Figure 3B:
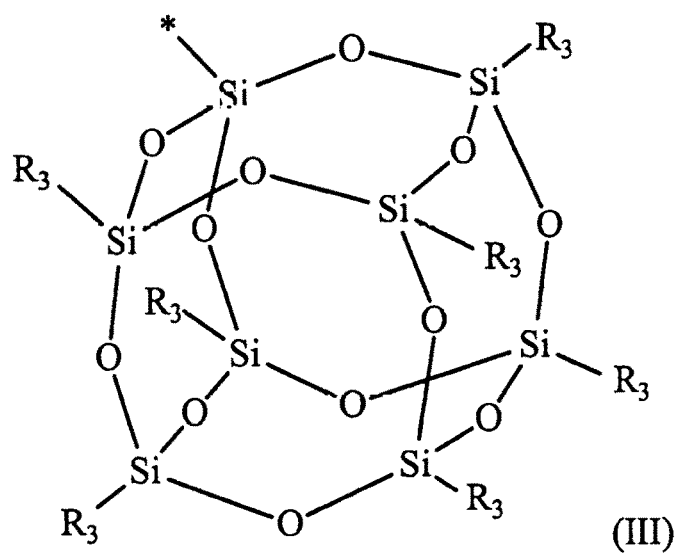
Figure 3C:
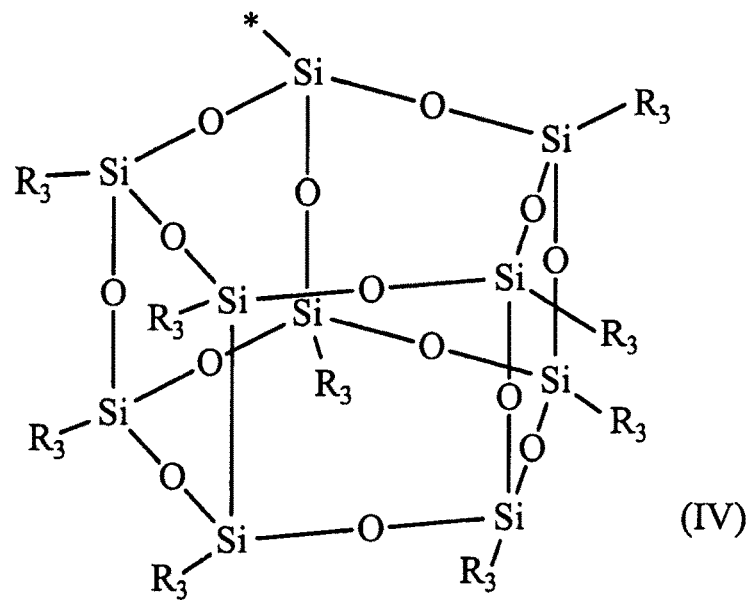
Figure 3D:
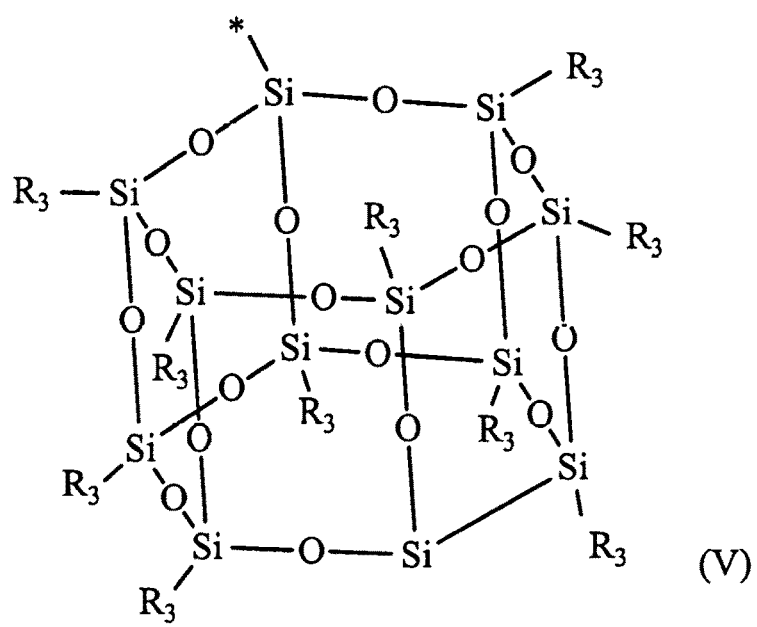
Figure 3E:
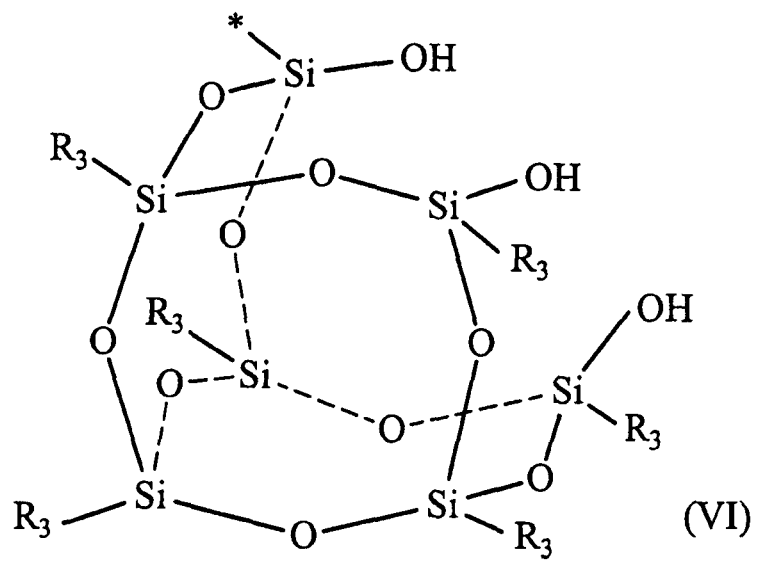
Figure 3F:
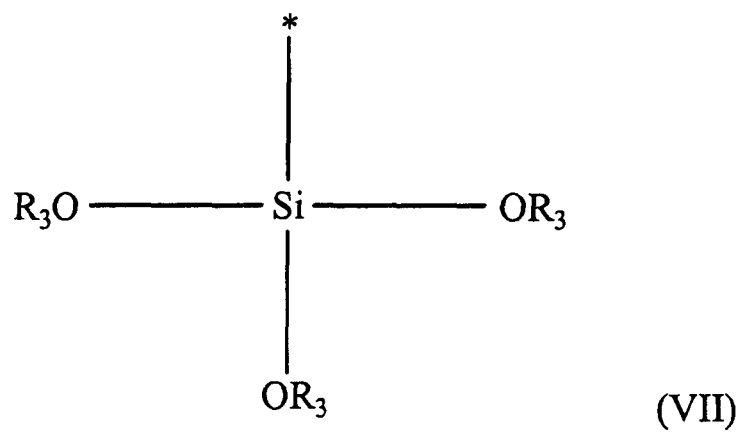
Figure 3G:
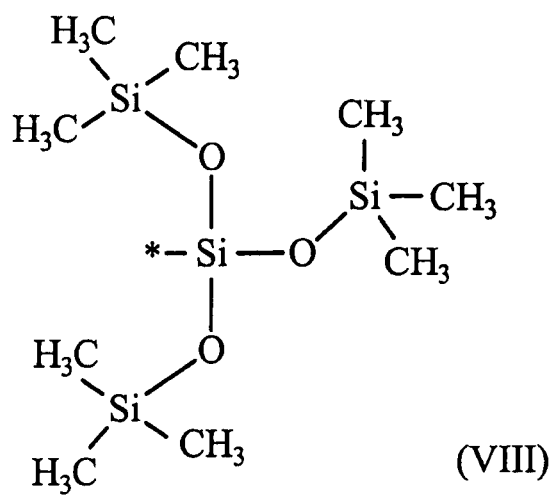
Figure 3H:
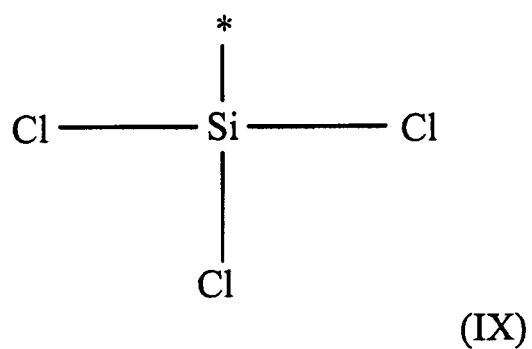

The first group 142 (labeled as "A") is used to enhance the etching selectivity of the middle layer 108 and improve film formation of the middle layer 108. In some embodiments, the first group 142 includes a siloxane-based group with silicon-oxygen (Si—O) bonds. FIGS. 3A-3H show diagrammatical views of chemical formulas (II)-(IX), in accordance with some embodiments of the disclosure. In some embodiments, the siloxane-based group includes formula (II) as shown in FIG. 3A, formula (III) as shown in FIG. 3B, formula (IV) as shown in FIG. 3C, formula (V) as shown in FIG. 3D, formula (VI) as shown in FIG. 3 E, formula (VII) as shown in FIG. 3F, formula (VIII) as shown in FIG. 3G or formula (IX) as shown in FIG. 3H, wherein $R_3$ is hydrogen or liner $C_1$-$C_6$ alkyl. The symbol "*" represents the bond to $R_2$ of the first group 142 of formula (I).

The second group 144 (labeled as "B") is used to provide crosslinking sites to improve film formation of the middle layer. In some embodiments, the second group 144 includes a crosslinkable group. In some embodiments, the crosslinkable group includes aliphatic epoxy, cycloaliphatic epoxy, oxetane, or aziridine.

The third group 146 (labeled as "D") is used to increase the solubility of the middle layer 108 in the subsequent wet etching process. In some embodiments, the third group 146 includes a hydrophilic group. In some embodiments, the hydrophilic group includes ethylene glycol (n=1-10), propylene glycol (n=1-10), hydroxy benzene, benzoid acid, benzenesulfonic acid, benzene phosphonic acid, hydroxyl, carboxylic acid, sulfonic acid, phosphoric acid, cyclic lactone (such as γ-butyrolactone), cyclic carbonate (such as ethylene carbonate), cyclic sultone (such as propane sultone or butane sultone).

Figure 4A:
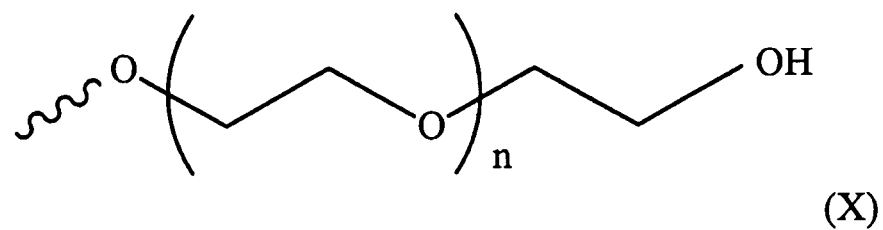
FIGS. 4A-4B show diagrammatical views of chemical formulas (X) and (XI), in accordance with some embodiments of the disclosure.

In some embodiments, the ethylene glycol has a formula (X) as shown in FIG. 4A.

Figure 4B:
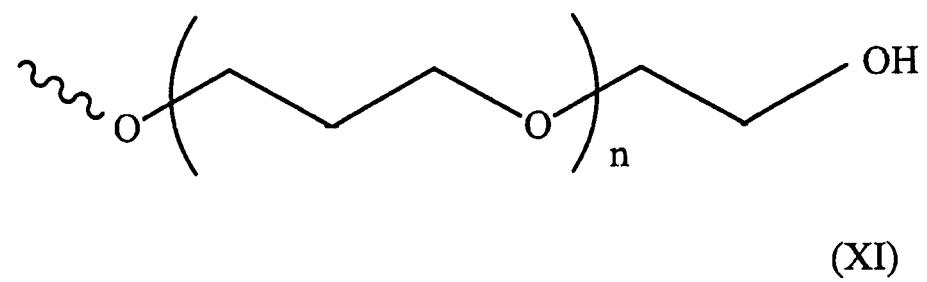

In some embodiments, the propylene glycol has a formula (XI) as shown in FIG. 4B.

In some embodiments, the middle layer 108 has a water contact angle in a range from about 20 degrees to about 70 degrees. The water contact angle represents the middle layer 108 having a hydrophilic surface which can improve the solubility of the middle layer 108 in the subsequent etching solution.

If there is no hydrophilic group in the middle layer, it is difficult for the middle layer to react with the wet etching solution (such as a base solution). As a result, the silicon-oxygen (Si—O) bond may be removed by the wet etching process. The third group 146 (labeled as "D") is bonded to the carbon backbone of the middle layer 108 to increase the wettability. When the middle layer 108 and the basic solution have a smaller contact area, the removal rate (or etching rate) of the etching process for removing the silicon-oxygen (Si—O) bond is increased. In addition, the acid groups of the third group 146 (labeled as "D") are chemically reacted with the basic solution to speed up the etching rate.

Figure 5A:
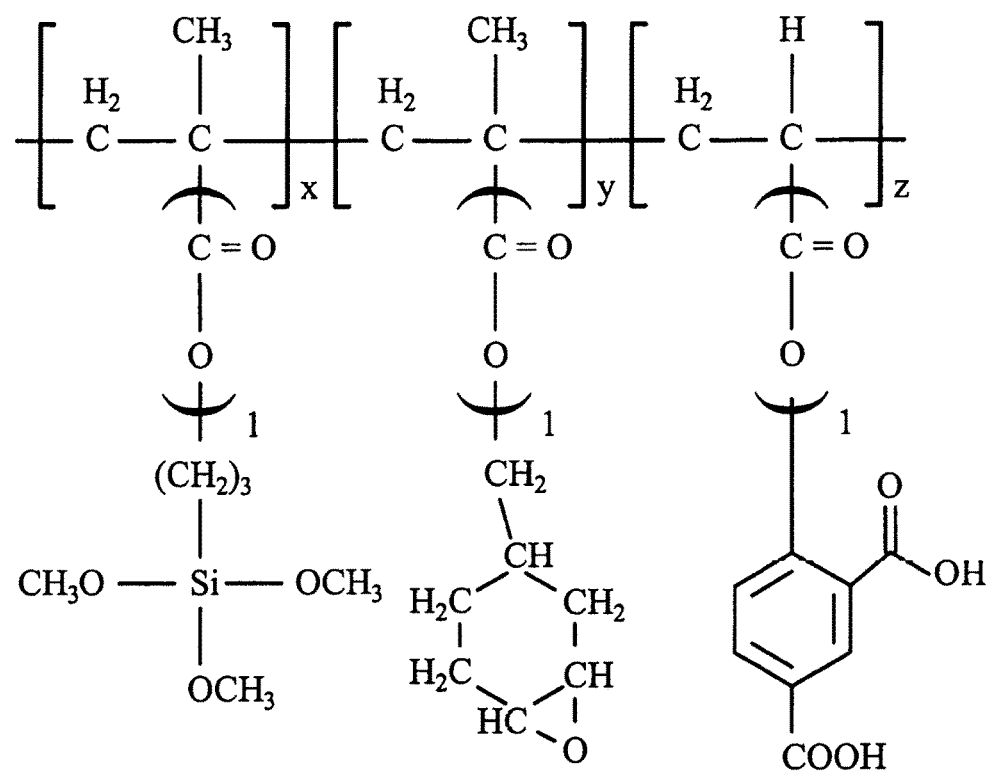
FIGS. 5A-5D diagrammatical views of chemical formulas (XII)-(XIV), in accordance with some embodiments of the disclosure.

In some embodiments, the middle layer 108 has a formula (XII) as shown in FIG. 5A.

Figure 5B:
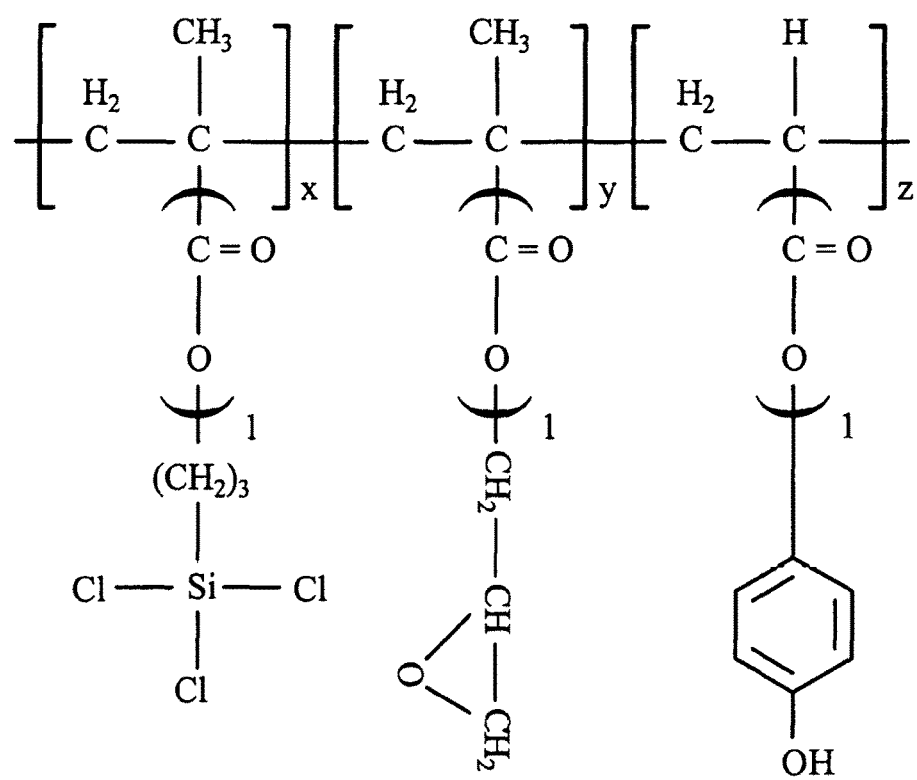

In some embodiments, the middle layer 108 has a formula (XIII) as shown in FIG. 5B.

Figure 5C:
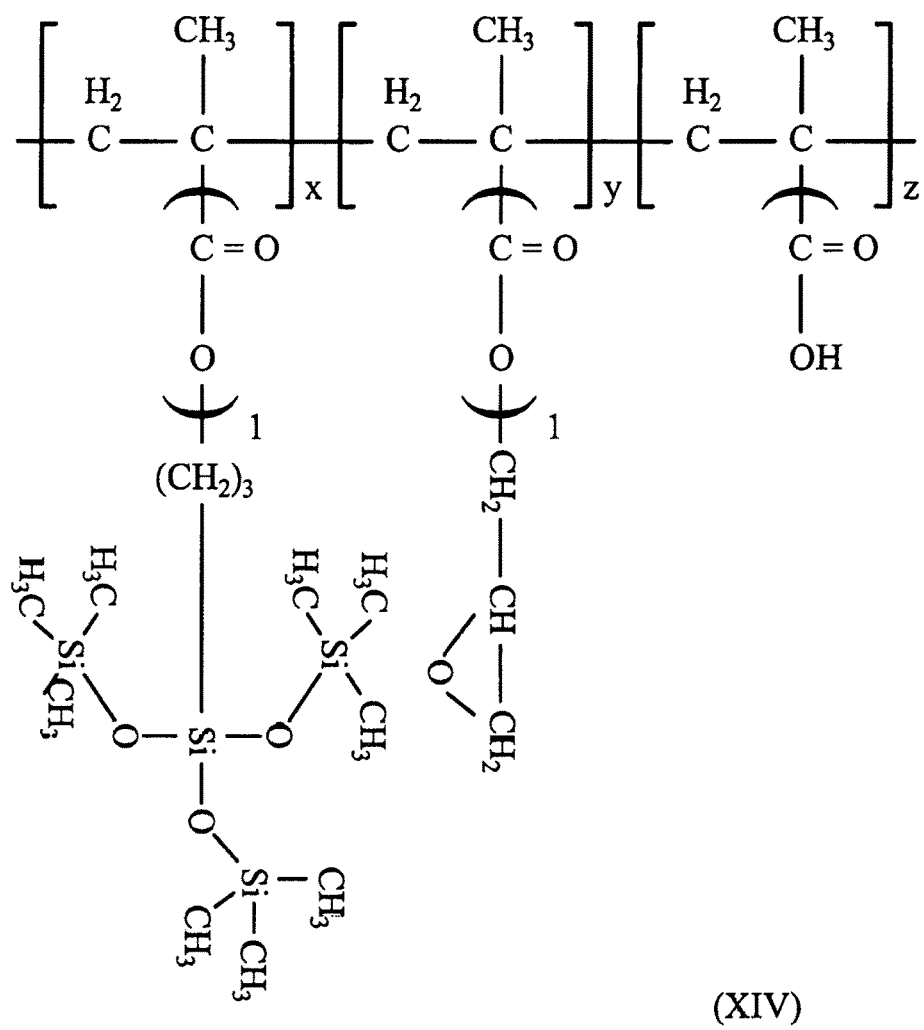

In some embodiments, the middle layer 108 has a formula (XIV) as shown in FIG. 5C.

Figure 5D:
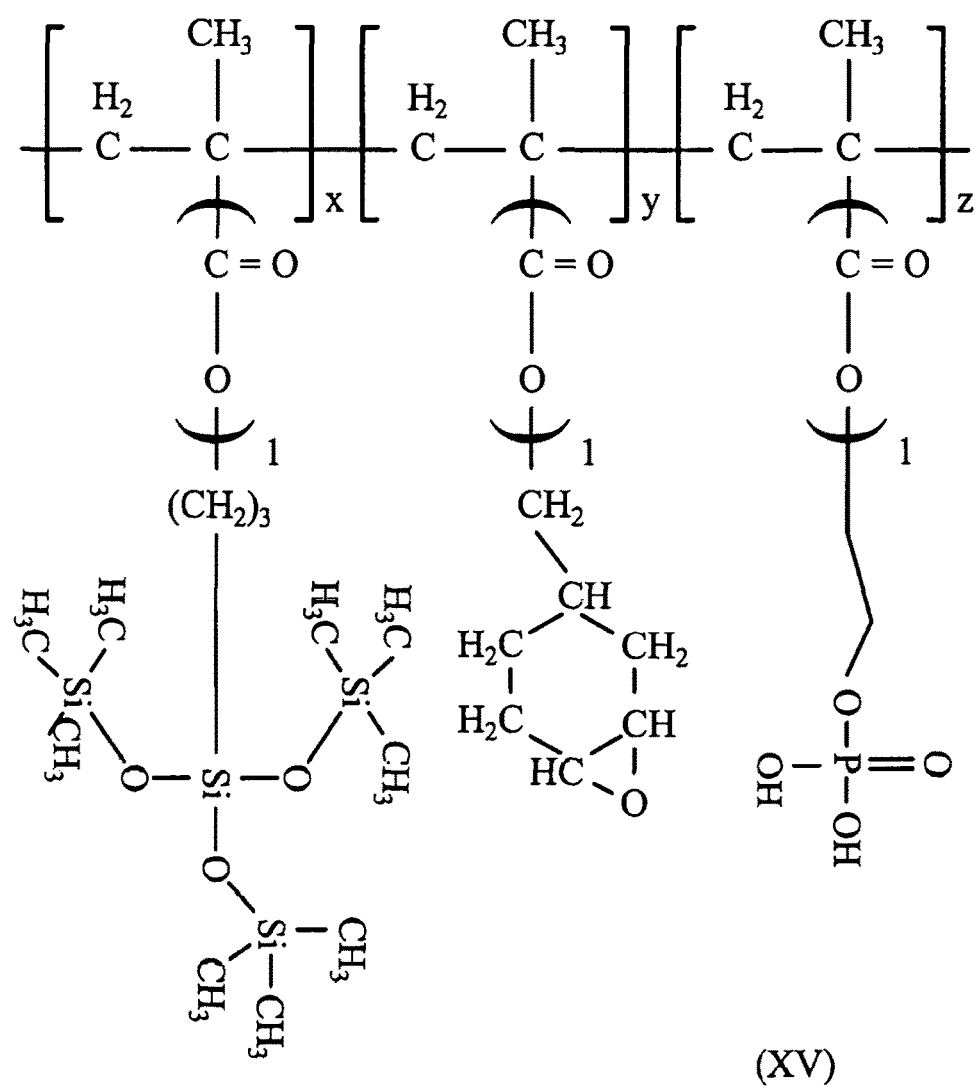

In some embodiments, the middle layer 108 has a formula (XV) as shown in FIG 5D.

In some embodiments, the middle layer 108 is a silicon-containing inorganic polymer having a weight average molecular weight in a range from about 3,000 to about 15,000. In some embodiments, the middle layer 108 has a silicon concentration in weight percentage in a range from about 5% to about 20%. If the silicon concentration is too low, the etching selectivity between the middle layer 108 and the bottom layer 106 may be too low, or it is hard for the polymer to form a film. If the silicon concentration is too high, the silicon-oxygen (Si—O) bonding is hard to remove in the following etching process.

In some embodiments, the middle layer 108 includes a solvent, such as isopropyl alcohol (IPA), propylene glycol methyl ether (PGEE), propylene glycol monomethyl ether acetate (PGMEA), $H_2O$, ether, alcohol, ketone, ester a combination thereof.

Furthermore, the middle layer 108 includes cross-linkers, dyes and additives. The cross-linkers are configured to cross-link various chemical compounds in the middle layer 108. In some embodiments, the cross-linkers are organic cross-linkers. In some embodiments, the cross-linkers include an aromatic structure, an aliphatic structure, or a combination thereof. The dyes are sensitive to light and are able to modify the characteristics (such as the refractive index n and extinction coefficient K) of the middle layer 108. The additives may include various chemicals designed to modify the characteristics and enhance of the performance (such as the wettability and accordingly the enhancement of the etching mechanism during the etching process) of the middle layer 108. In some embodiments, the additives include surfactant, fluoro-containing groups, or a combination thereof.

Figure 1C:
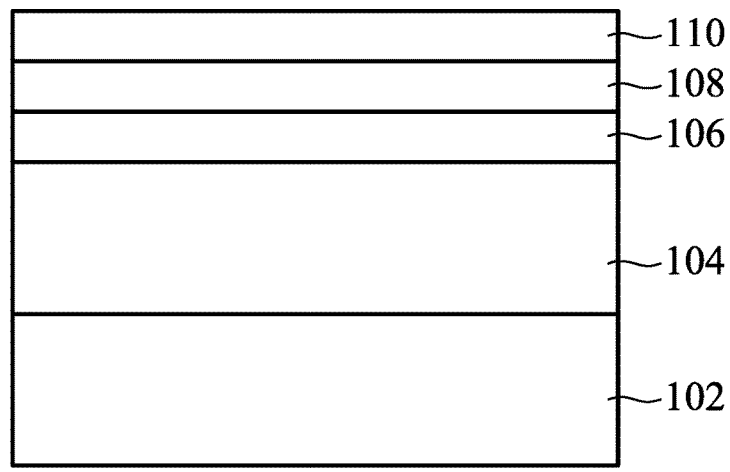

Afterwards, as shown in FIG. 1C, a top layer 110 is formed over the middle layer 108, in accordance with some embodiments of the disclosure. The top layer 110 may be positive photoresist or negative photoresist. In some embodiments, the top layer 122 includes a carbon backbone polymer. In some embodiments, the top layer 110 is a chemical amplified (CA) resist. In some embodiments, the top layer 110 is made of Poly (methyl methacrylate) (PMMA), Poly (methyl glutarimide) (PMGI), Phenol formaldehyde resin (DNQ/Novolac), SU-8 or another applicable material. The top layer 110 may include a photo-acid generator (PAG). When the top layer 110 is exposed to radiation (e.g. light), the PAG forms a small amount of acid. The PAG may have a concentration ranging between about 1% and 30% weight of the top layer 110.

In some embodiments, the top layer 110 is a positive photoresist layer used with a negative tone developer. In some embodiments, when the top layer 110 is a positive photoresist layer, a portion of the top layer 110 exposed to radiation (e.g. light), the exposed portion will become soluble in a developer, while an unexposed portion of the top layer 110 will become insoluble or less soluble in a developer. In some other embodiments, the top layer 110 is a negative photoresist layer used with a positive tone developer.

The radiation energy may include a 248 nm beam by Krypton Fluoride (KrF) excimer lasers, a 193 nm beam by Argon Fluoride (ArF) excimer lasers, a 157 nm beam by Fluoride (F2) Excimer Lasers, or Extreme ultra-violet (EUV) light, such as EUV light with wavelength at about 13.5 nm. After the exposing process, other processing steps, such as a post-exposure-baking (PEB) process is followed. In some embodiments, the top layer 110 is a chemically amplified resist (CAR) and the bake process is configured to improve the insolubility.

Figure 1D:
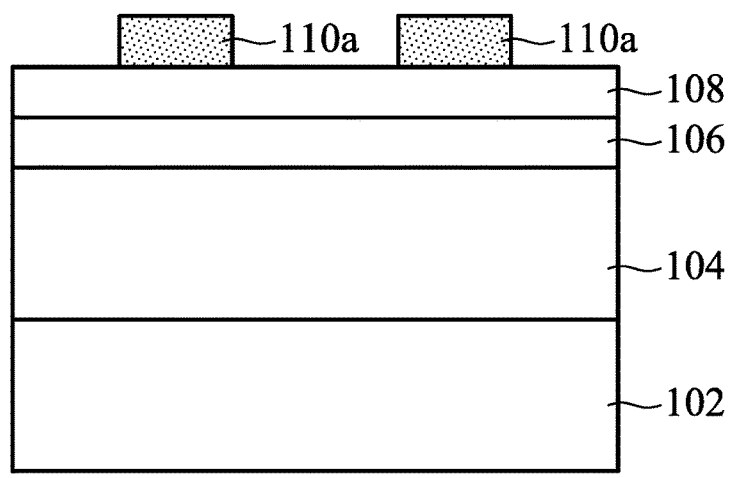

Afterwards, as shown in FIG. 1D, the top layer 110 is developed by a developer to form a patterned top layer 110a, in accordance with some embodiments of the disclosure.

In some embodiments, the developer includes an organic solvent. The organic solvent may include a solvent such as, for example, a ketone-based solvent, ester-based solvent, alcohol-based solvent, amide-based solvent, ether-based solvent, hydrocarbon-based solvent, and/or other suitable solvent.

Figure 1E:
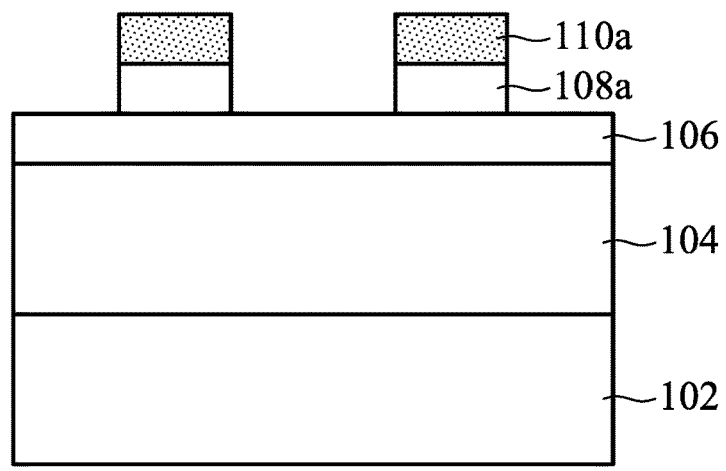

Afterwards, as shown in FIG. 1E, a portion of the middle layer 108 is removed by using the patterned top layer 110a as a mask to form a patterned middle layer 108a, in accordance with some embodiments of the disclosure. As a result, the pattern of the patterned top layer 110a is transferred to the middle layer 108.

The portion of the middle layer 108 is removed by a dry etching process, a wet etching process or a combination thereof. In some embodiments, the etching process includes a plasma etching process using an etchant having fluorine, such as $CF_2$, $CF_3$, $CF_4$, $C_2F_2$, $C_2F_3$, $C_3F_4$, $C_4F_4$, $C_4F_6$, $C_5F_6$, $C_6F_6$, $C_6F_8$, or a combination thereof.

Figure 1F:
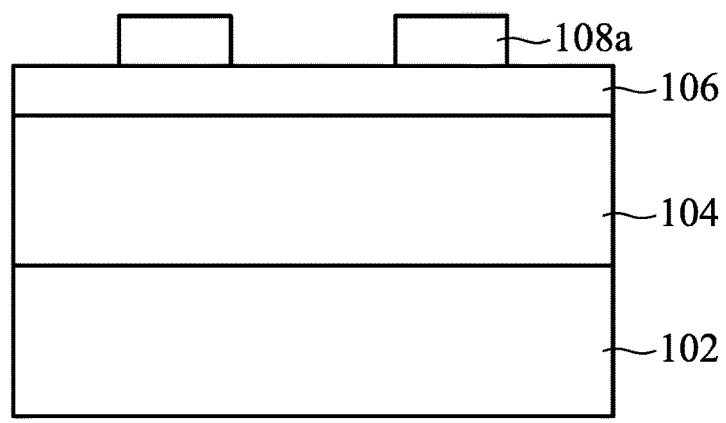

Afterwards, as shown in FIG. 1F, the patterned top layer 110 is removed, in accordance with some embodiments of the disclosure. In some embodiments, the patterned top layer 110 is removed by a wet etching process or a dry etching process.

Figure 1G:
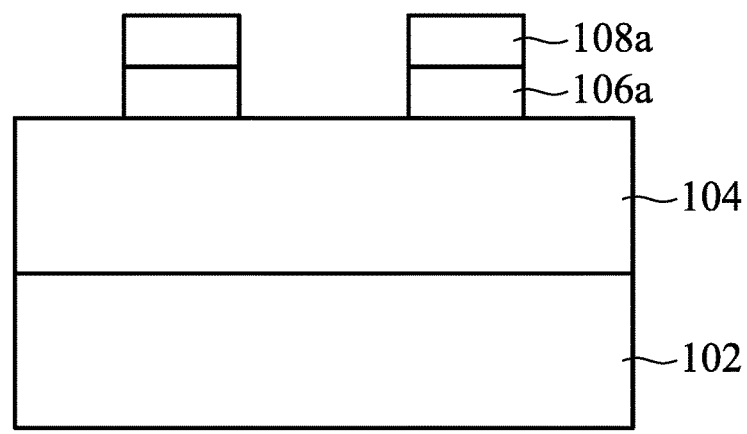

Next, as shown in FIG. 1G, a portion of the bottom layer 106 is removed by using the patterned middle layer 108a as a mask to form a patterned bottom layer 106a, in accordance with some embodiments of the disclosure. As a result, the pattern of the patterned middle layer 108a is transferred to the bottom layer 106.

In some embodiments, since the middle layer 108 is a silicon-containing material while the under layer 106 is a silicon-free material, the etching selectivity is achieved through proper choice of the etchant. In some embodiments, the portion of the bottom layer 106 is removed by a plasma etching process using an etchant having a sulfur-containing gas and an oxygen-containing gas. In some embodiments, the oxygen-containing gas includes oxygen ($O_2$). In some embodiments, the sulfur-containing gas includes carbonyl sulfide (COS) or sulfur dioxide ($SO_2$).

It should be noted that when the portion of the bottom layer 106 is removed, a portion of patterned middle layer 108a is removed along the bottom layer 106. As a result, the patterned middle layer 108a is densified by the plasma etching process, and the patterned middle layer 108a includes silicon oxide (SiOx) having a number of Si—O bonds. The Si—O bonds are difficult to be removed and unwanted residues may remain on the material layer 104 by the subsequent wet etching process.

Figure 1H:
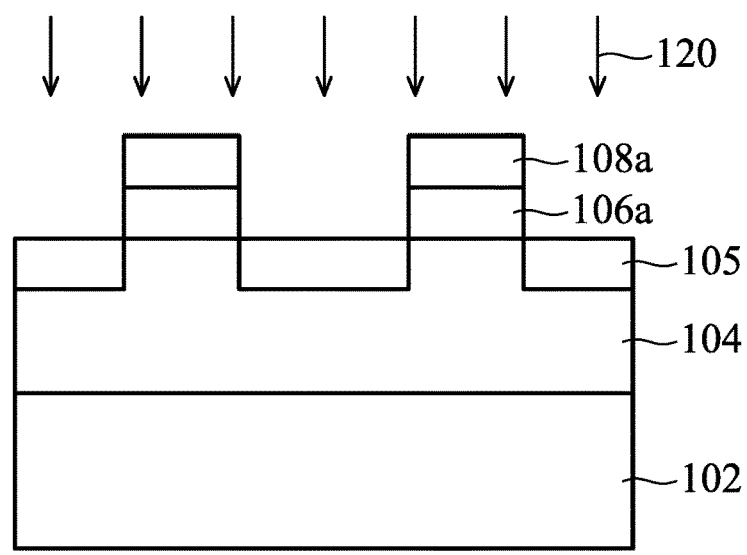

Afterwards, as shown in FIG. 1H, a portion of the material layer 104 is doped by performing an ion implantation process 120 and using the patterned middle layer 108a and the patterned bottom layer 106a as a mask, in accordance with some embodiments of the disclosure. As a result, a doped region 105 is formed in the material layer 104. The doped region 105 may be doped with p-type dopants, such as boron or $BF_2$, and/or n-type dopants, such as phosphorus (P) or arsenic (As).

In some other embodiments, a portion of the material layer 104 is removed by performing an etching process and using the patterned middle layer 108a and the patterned bottom layer 106a as a mask.

Figure 1I:
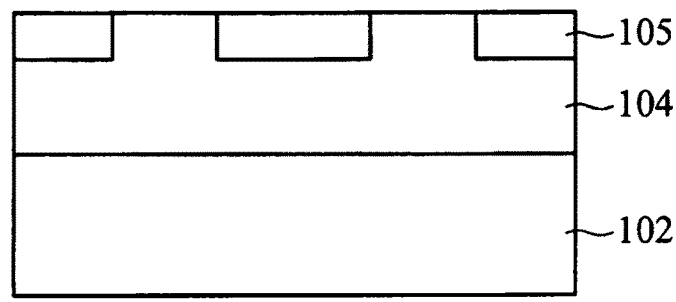

In some embodiments, before the step of FIG. 1I, a plasma treatment process is performed to the patterned silicon-containing middle layer and the patterned bottom layer. The plasma treatment process includes using hydrogen gas ($H_2$) and nitrogen gas ($N_2$) to remove some residues produced from the step of FIG. 1H. In some embodiments, some silicon-oxygen (Si—O) bonds are removed by the plasma treatment process.

Afterwards, as shown in FIG. 1I, the patterned middle layer 108a and the patterned bottom layer 106a are removed by a wet etching process, in accordance with some embodiments of the disclosure. The wet etching process includes a number of etching processes.

In some embodiments, the patterned middle layer 108a is firstly removed by applying a first etching solution. The first etching solution is used to remove the inorganic materials and particles. In some embodiments, the first etching solution includes ammonium hydroxide ($NH_4OH$), hydrogen peroxide ($H_2O_2$) and water. In some embodiments, the etching rate of the middle layer 108 in the first etching solution is in a range from about 100 angstroms/min to about 200 angstroms/min. When the etching rate is within above-mentioned range, the removal efficiency is improved.

It should be noted that the middle layer 108 is designed to have a hydrophilic group. Therefore, the wettability and solubility of the middle layer 108 is improved during the first etching process. Once the middle layer 108 become more soluble in the base solution, the Si—O bonds in the middle layer 108 have more chances to be removed by the first etching solution. In addition, as mentioned above, the unwanted residues (such as Si—O bonds) are removed by the first etching process.

Afterwards, the patterned bottom layer 106a is removed by applying a second etching solution. The second etching solution is used to remove the organic materials in the patterned bottom layer 106a.

In some embodiments, the second etching solution includes sulfuric acid ($H_2SO_4$), hydrogen peroxide ($H_2O_2$) and water. In some embodiments, the second etching solution is performed at a temperature in a range from about 120 degrees to about 180 degrees. The etching rater for removing the patterned bottom layer 106a is further improved by controlling the temperature within the above-mentioned range.

In some other embodiments, after the second etching solution, the etching process further includes applying a third etching solution includes diluted hydrofluoric acid (DHF) and water. The diluted hydrofluoric acid (DHF) is used to remove remaining inorganic materials, such as Si—O bonds. In some embodiments, the water and diluted hydrofluoric acid (DHF) has weight ratio in a range from about from about 100/1 to about 500/1. However, the diluted hydrofluoric acid (DHF) may damage the material layer 104 and/or the substrate 102.

In order to reduce the amount of the diluted hydrofluoric acid (DHF), or even without using the diluted hydrofluoric acid (DHF), the middle layer 104 is designed to have the hydrophilic group to improve the solubility of the middle layer 108 in the first etching solution (such as a base solution). The inorganic materials, such as Si—O bonds, in the middle layer 108 are effectively and completely removed by the first etching solution. Therefore, in some other embodiments, the etching process does not include the third etching solution including diluted hydrofluoric acid (DHF) since the inorganic Si—O bonds are completely removed by the first etching solution.

In some other embodiments, the wet etching process includes a first etching solution including sulfuric acid ($H_2SO_4$), hydrogen peroxide ($H_2O_2$) and water, and a second etching solution including ammonium hydroxide ($NH_4OH$), hydrogen peroxide ($H_2O_2$) and water. The patterned middle layer 108a and the patterned bottom layer 106a are removed by the first etching solution and the second etching solution, and the wet etching process does not include using diluted hydrofluoric acid (DHF). Therefore, the substrate 102 and the material layer 104 are not damaged by the diluted hydrofluoric acid (DHF).

Embodiments for forming a semiconductor device structure are provided. A tri-layer photoresist layer is formed over a material layer over a substrate. The tri-layer photoresist layer includes a bottom layer, a silicon-containing middle layer and a top layer. The tri-layer photoresist layer is used to pattern the underlying material layer and then is removed. The silicon-containing middle layer includes a carbon backbone and a side chain having a hydrophilic group bonded to the carbon backbone. The middle layer is removed by a first etching solution and a second etching solution in sequence. The hydrophilic group of the middle layer is used to improve the solubility of the middle layer in the first etching solution (such as a base solution). Some organic bonds in the middle layer are removed by the second etching solution. The unwanted silicon-oxygen (Si—O) bonds are completely removed by the first etching solution without using the third etching solution comprising diluted hydrofluoric acid (DHF). Therefore, the substrate and the material layer over the substrate are prevented from being etched or damaged during the wet etching process.

In some embodiments, a method for forming a semiconductor structure is provided. The method includes forming a bottom layer over a substrate and forming a silicon-containing middle layer over the bottom layer. The silicon-containing middle layer includes a carbon backbone and a first side chain bonded to the carbon backbone, and the first side chain has a hydrophilic group. The method also includes forming a top layer over the silicon-containing middle layer and patterning the top layer to form a patterned top layer. The method further includes patterning the silicon-containing middle layer by using the patterned top layer as a mask to form a patterned silicon-containing middle layer. The method includes patterning the bottom layer by using the patterned silicon-containing middle layer as a mask to form a patterned bottom layer. The method also includes removing the patterned silicon-containing middle layer and the patterned bottom layer by performing a wet etching process. The wet etching process includes a base solution, and the middle layer is soluble in the base solution by the hydrophilic group.

In some embodiments, a method for forming a semiconductor structure is provided. The method includes forming a material layer over a substrate and forming a bottom layer over the material layer. The method also includes forming a silicon-containing middle layer over the bottom layer, wherein the middle layer includes a carbon backbone having a first segment, a second segment and a third segment; a first side chain bonded to the first segment, wherein the first side chain is a siloxane-based group; a second side chain bonded to the second segment, wherein the second side chain is a crosslinkable group; and a third side chain bonded to the third segment, wherein the third side chain is a hydrophilic group. The method also includes forming a top layer over the silicon-containing middle layer and removing a portion of the top layer to form a patterned top layer. The method further includes removing a portion of the silicon-containing middle layer by using the patterned top layer as a mask to form a patterned silicon-containing middle layer and removing a portion of the bottom layer by using the patterned silicon-containing middle layer as a mask to form a patterned bottom layer. The method also includes removing the patterned silicon-containing middle layer by using a base solution, and the middle layer is soluble in the base solution.

In some embodiments, a method for forming a semiconductor structure is provided. The method includes forming a bottom layer over a substrate and forming a silicon-containing middle layer over the bottom layer. The silicon-containing middle layer includes a carbon backbone and a first side chain bonded to the carbon backbone, and the first side chain has a hydrophilic group. The method also includes patterning the silicon-containing middle layer to form a patterned silicon-containing middle layer and patterning the bottom layer by using the patterned silicon-containing middle layer as a mask to form a patterned bottom layer. The method further includes removing the patterned silicon-containing middle layer by using a first etching solution, and the patterned silicon-containing middle layer is soluble in the first etching solution by the hydrophilic group. The method also includes removing the patterned bottom layer by using a second etching solution.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a material layer over the substrate;
    forming a bottom layer over a substrate;
    forming a silicon-containing middle layer over the bottom layer, wherein the silicon-containing middle layer comprises a carbon backbone and a first side chain bonded to the carbon backbone, and the first side chain has a hydrophilic group;
    forming a top layer over the silicon-containing middle layer;
    patterning the top layer to form a patterned top layer;
    patterning the silicon-containing middle layer by using the patterned top layer as a mask to form a patterned silicon-containing middle layer;
    patterning the bottom layer by using the patterned silicon-containing middle layer as a mask to form a patterned bottom layer;
    removing the patterned silicon-containing middle layer and the patterned bottom layer by performing a wet etching process, wherein the wet etching process comprises a base solution, and the middle layer is soluble in the base solution by the hydrophilic group; and
    performing an etching process or an ion implantation process to the material layer by using the patterned bottom layer as a mask.

2. The method for forming the semiconductor structure as claimed in claim 1, wherein the silicon-containing middle layer further comprises a second side chain bonded to the carbon backbone, and the second side chain comprises a siloxane-based group.

3. The method for forming the semiconductor structure as claimed in claim 2, wherein the silicon-containing middle layer further comprises a third side chain bonded to the carbon backbone, and the third side chain comprises a crosslinkable group.

4. The method for forming the semiconductor structure as claimed in claim 1, wherein performing the wet etching process comprises:
    applying a first etching solution comprising ammonium hydroxide ($NH_4OH$), hydrogen peroxide and water; and
    applying a second etching solution comprising sulfuric acid ($H_2SO_4$), hydrogen peroxide ($H_2O_2$) and water.

5. The method for forming the semiconductor structure as claimed in claim 4, wherein an etching rate of the middle layer in the first etching solution is in a range from about 100 angstroms/min to about 200 angstroms/min.

6. The method for forming the semiconductor structure as claimed in claim 4, wherein performing the wet etching process does not comprise applying a third etching solution comprising diluted hydrofluoric acid (DHF).

7. The method for forming the semiconductor structure as claimed in claim 1, wherein the middle layer has a formula (I),

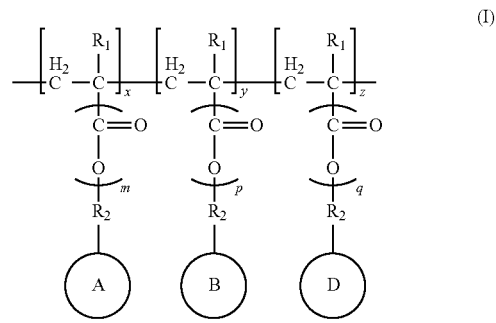

wherein $R_1$ is hydrogen or liner $C_1$-$C_6$ alkyl;
$R_2$ is hydrogen or liner $C_1$-$C_6$ alkyl;
each x, y z independently represents a mole ratio of each monomer unit, and x+y+z=1;
each m, p, q independently represent an integer of 0 or 1;
A is a siloxane-based group which enhances the etching selectivity of the middle layer;
B is crosslinkable group which provides cross-linking sites to improve film formation of the middle layer; and
D is hydrophilic group which increases the solubility of the middle layer in the wet etching process.

8. The method for forming the semiconductor structure as claimed in claim 1, further comprising:
    performing a plasma treatment process to the patterned silicon-containing middle layer and the patterned bottom layer, wherein the plasma treatment process comprises using hydrogen gas ($H_2$) and nitrogen gas ($N_2$) before removing the patterned silicon-containing middle layer and the patterned bottom layer.

9. The method for forming the semiconductor structure as claimed in claim 1, further comprising:
    densifying the patterned silicon-containing middle layer when patterning the bottom layer, such that the patterned silicon-containing middle layer comprises silicon-oxygen bond (Si—O), wherein the silicon-oxygen bond (Si—O) is removed by the wet etching process.

10. The method for forming the semiconductor structure as claimed in claim 1, wherein the silicon-containing middle layer has a silicon concentration in weight percentage in a range from about 5% to about 20%.

11. A method for forming a semiconductor structure, comprising:

forming a material layer over a substrate;
forming a bottom layer over the material layer;
forming a silicon-containing middle layer over the bottom layer, wherein the middle layer comprises:
    a carbon backbone having a first segment, a second segment and a third segment;
    a first side chain bonded to the first segment, wherein the first side chain is a siloxane-based group;
    a second side chain bonded to the second segment, wherein the second side chain is a crosslinkable group; and
    a third side chain bonded to the third segment, wherein the third side chain is a hydrophilic group;
forming a top layer over the silicon-containing middle layer;
removing a portion of the top layer to form a patterned top layer;
removing a portion of the silicon-containing middle layer by using the patterned top layer as a mask to form a patterned silicon-containing middle layer;
removing a portion of the bottom layer by using the patterned silicon-containing middle layer as a mask to form a patterned bottom layer; and
removing the patterned silicon-containing middle layer by using a base solution, wherein the middle layer is soluble in the base solution.

12. The method for forming the semiconductor structure as claimed in claim 11, further comprising:
    removing the patterned bottom layer by using a wet etching solution comprising sulfuric acid ($H_2SO_4$), hydrogen peroxide ($H_2O_2$) and water after the base solution.

13. The method for forming the semiconductor structure as claimed in claim 11, wherein the middle layer has a silicon concentration in weight percentage in a range from about 5% to about 20%.

14. The method for forming the semiconductor structure as claimed in claim 11, wherein a first mole ratio of the first segment is inversely proportional to a second mole ratio of the second segment.

15. The method for forming the semiconductor device structure as claimed in claim 11, further comprising:
    densifying the patterned silicon-containing middle layer when removing the portion of the bottom layer, such that the patterned silicon-containing middle layer comprises a silicon-oxygen (Si—O) bond, wherein the silicon oxygen (Si—O) bond is removed by the base solution.

16. A method for forming a semiconductor device structure, comprising:
    forming a bottom layer over a substrate;
    forming a silicon-containing middle layer over the bottom layer, wherein the silicon-containing middle layer comprises a carbon backbone and a first side chain bonded to the carbon backbone, and the first side chain has a hydrophilic group;
    patterning the silicon-containing middle layer to form a patterned silicon-containing middle layer;
    patterning the bottom layer by using the patterned silicon-containing middle layer as a mask to form a patterned bottom layer; and
    removing the patterned silicon-containing middle layer by using a first etching solution, wherein the patterned silicon-containing middle layer is soluble in the first etching solution by the hydrophilic group; and
    removing the patterned bottom layer by using a second etching solution.

17. The method for forming the semiconductor structure as claimed in claim 16, wherein the first etching solution comprises ammonium hydroxide ($NH_4OH$), hydrogen peroxide ($H_2O_2$) and water.

18. The method for forming the semiconductor structure as claimed in claim 16, wherein the second etching solution comprises sulfuric acid ($H_2SO_4$), hydrogen peroxide ($H_2O_2$) and water.

19. The method for forming the semiconductor structure as claimed in claim 18, further comprising:
    densifying the patterned silicon-containing middle layer when patterning the bottom layer, such that the patterned silicon-containing middle layer comprises silicon oxide (SiOx), wherein the silicon oxide (SiOx) is removed by the first etching solution.

20. The method for forming the semiconductor structure as claimed in claim 16, further comprising:
    performing a plasma treatment process to the patterned silicon-containing middle layer and the patterned bottom layer, wherein the plasma treatment process comprises using hydrogen gas ($H_2$) and nitrogen gas ($N_2$) before removing the patterned silicon-containing middle layer.

* * * * *